United States Patent
Chen et al.

(10) Patent No.: US 7,330,376 B1
(45) Date of Patent: Feb. 12, 2008

(54) METHOD FOR MEMORY DATA STORAGE BY PARTITION INTO NARROWER THRESHOLD VOLTAGE DISTRIBUTION REGIONS

(75) Inventors: Chung-Kuang Chen, Hsinchu (TW); Ful-Long Ni, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/460,483

(22) Filed: Jul. 27, 2006

(51) Int. Cl.
  *G11C 16/34* (2006.01)
(52) U.S. Cl. .......... 365/185.24; 365/185.22; 365/185.2; 365/185.33; 365/185.03
(58) Field of Classification Search ........ 365/185.21, 365/185.22, 185.2, 185.24, 185.11, 185.03, 365/185.33
  See application file for complete search history.

(56) References Cited

U.S. PATENT DOCUMENTS

| | | | |
|---|---|---|---|
| 6,175,519 B1 * | 1/2001 | Lu et al. | 365/185.02 |
| 6,181,604 B1 * | 1/2001 | Lu et al. | 365/185.22 |
| 6,775,187 B1 * | 8/2004 | Hamilton et al. | 365/185.28 |
| 7,187,585 B2 * | 3/2007 | Li et al. | 365/185.2 |

FOREIGN PATENT DOCUMENTS

EP  0977258 A1 *  2/2000

* cited by examiner

Primary Examiner—Andrew Q. Tran
(74) Attorney, Agent, or Firm—J.C. Patents

(57) ABSTRACT

A method for data storage of a memory unit and a memory unit using the same are provided in the present invention. The method for data storage of a memory unit includes: first, dividing a memory unit into a plurality of small memory groups; next, defining a threshold voltage distribution region for each small memory group; then, defining a plurality of program verify threshold voltages and a plurality of reference detecting values for each small memory group according to the threshold voltage distribution region of each small memory group; and after that, using these small memory groups to store data.

15 Claims, 5 Drawing Sheets

METHOD FOR MEMORY DATA STORAGE BY PARTITION INTO NARROWER THRESHOLD VOLTAGE DISTRIBUTION REGIONS

BACKGROUND OF THE INVENTION

1. Field of Invention

The present invention relates to a method for data storage and a unit using the same, and more particularly to a method for data storage of a memory unit and a memory unit using the same.

2. Description of Related Art

Along with the rapid development of science and technology at present, for storing a large amount of data, memory is being developed to have larger capacity, higher speed, longer service life, and being more power-saving. Generally, memory with a capacity of hundreds of M (megabytes) already cannot meet the demands, and memory with a capacity of several G (gigabytes) or hundreds of G (gigabytes) has appeared. However, the property of high capacity of the memory may easily cause the voltage distribution range of data storage in the memory to become excessively large. Thus, there are two defects of the conventional art. First, to increase the sensing window between each state (for example, the first state is set to logic level "1" and the second state is set to logic level "0") to enhance the sensing effect, the program threshold voltage difference between each state must be increased, which results in more power consumption and shorter service life. Second, to reduce the program threshold voltage difference between each state to prolong the service life and reduce the power consumption of the memory, the sensing window between each state is thus reduced, which results in difficulty to perform the sensing process for distinguishing each state. The following part will give an illustration with reference to FIGS. 1 and 2.

FIG. 1 is a threshold voltage distribution diagram of the data storage operation of a conventional memory unit. The horizontal axis represents the threshold voltage, and the longitudinal axis represents the number of bits. A threshold voltage distribution curve 101 and a threshold voltage distribution curve 102 represent distribution curves for a memory of 1M to store data in the first state and the second state. A threshold voltage distribution curve 103 and a threshold voltage curve 104 represent distribution curves for a memory of 1 G to store data in the first state and the second state. SW11 indicates the sensing window between the two states of a two-bits memory, SW12 and SW13 indicate the sensing window between two states of the memories of 1M memory and 1 G memory. DVt11 indicates the delta threshold voltage after program between the two states of a two-bits memory, DVt12 and DVt13 indicate the delta threshold voltage after program between two states of the memories of 1M memory and 1 G memory. Seen from FIG. 1, the distribution value D2 of the curve 103 is larger than the distribution value D1 of the curve 101. The two-bits memory has only one threshold voltage point, and thus the distribution value thereof is nearly zero. As shown in FIG. 1, it is presumed that every bit has the same program delta threshold voltage (DVt). Generally, the sensing window is defined as the threshold voltage difference between a high boundary of the low threshold voltage distribution and a low boundary of the high threshold voltage distribution, and the program delta threshold voltages for the two-bits memory such as 1M memory or 1 G memory are DVt11, DVt12 and DVt13 and are presumed to be the same, the sensing window voltage are different because the relationship between the sensing window and the program delta threshold voltage is SW11=DVt11, SW12=(DVt12−D1), and SW13=(DVt13−D2) respectively. To keep the program threshold voltage difference of each memory as the same, the sensing window SW13 of the high-capacity memory becomes smaller, thus making it difficult to distinguish the two states of the high-capacity memory.

FIG. 2 is a threshold voltage distribution diagram of the data storage operation of another conventional memory unit. The horizontal axis represents the threshold voltage, and the longitudinal axis represents the number of bits. A threshold voltage distribution curve 201 and a threshold voltage distribution curve 202 represent distribution curves for a 1M memory to store data in the first state and the second state, a threshold voltage distribution curve 203 and a threshold voltage distribution curve 205 represent distribution curves for a 1 G memory to store the data in the first state and the second state, and threshold voltage distribution curves 204, 206 represent distribution curves of a part of the bits in the memory of 1 G in the two states. The sensing windows of the two-bits 1M memory and 1 G memory are SW11, SW12 and SW13 respectively. The program threshold voltage differences between the two states of the two-bits 1M memory and 1 G memory are DVt21, DVt22 and DVt23 respectively. The relationships between the sensing window differences and the program threshold voltage differences are SW21=DVt21, SW22=(DVt22−D1), and SW23=(DVt23−D2). To keep the sensing window of each memory as the same, the program threshold voltage difference DVt23 between two states of the high-capacity memory is increased, thereby shortening the service time and increasing the power consumption.

SUMMARY OF THE INVENTION

An objective of the present invention is to provide a method for data storage of a memory unit, which can improve the cycling margin of the memory, prolong the service life thereof, and is suitable to be applied to the operating window of a multi-level-cell (MLC).

Another objective of the present invention is to provide a memory unit, which can prolong the service life of the memory, improve the cycling margin thereof, and is suitable to be applied to the operating window of an MLC.

The present invention provides a method for data storage of a memory unit, which comprises: first, dividing a memory unit into a plurality of small memory groups; next, defining a plurality of threshold voltage distribution regions for the plurality of small memory groups; then, defining a plurality of program verify threshold voltages and a plurality of reference detecting values according to the threshold voltage distribution regions of each small memory group; and after that, using the small memory groups to store data.

The present invention further provides a memory unit using the above storage method for a memory unit. The memory unit is divided into a plurality of small memory unit groups. Then, a plurality of program verify voltages and a plurality of reference detecting values of each memory group are determined according to the threshold voltage regions of small memory groups, so as to store data.

In the present invention, as the memory unit is divided into a plurality of small memory groups, and then the program verify threshold voltage and the reference detecting value of each small memory group are determined according to the threshold voltage distribution regions of each small memory group, the better cycling margin of the memory is improved, the service life of the memory is prolonged, and the present invention is suitable to be applied to the operating window of an MLC.

In order to make the aforementioned and other objects, features and advantages of the present invention comprehensible, preferred embodiments accompanied with figures are described in detail below.

DESCRIPTION OF EMBODIMENTS

The preferred embodiments of the present invention are described below with reference to the accompanied figures, wherein a flash memory is taken as an example in the embodiments to illustrate the operating principle of the present invention. However, the embodiments of the present invention are not limited to the flash memory, i.e., any memory unit in this field is suitable to be used in the present invention, such as an erasable programmable read only memory (EPROM), electrically erasable programmable read only memory (EEPROM), dynamic random access memory (DRAM) and static random access memory (SRAM).

Figure 1:
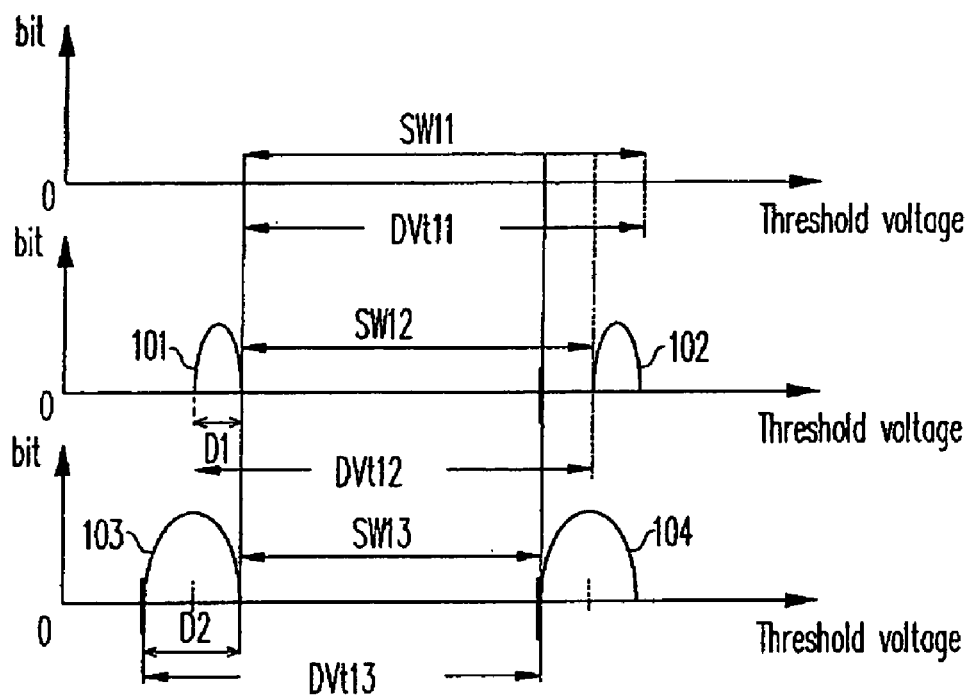
FIG. 1 is a threshold voltage distribution diagram of the data storage operation of a conventional memory unit.
Figure 2:
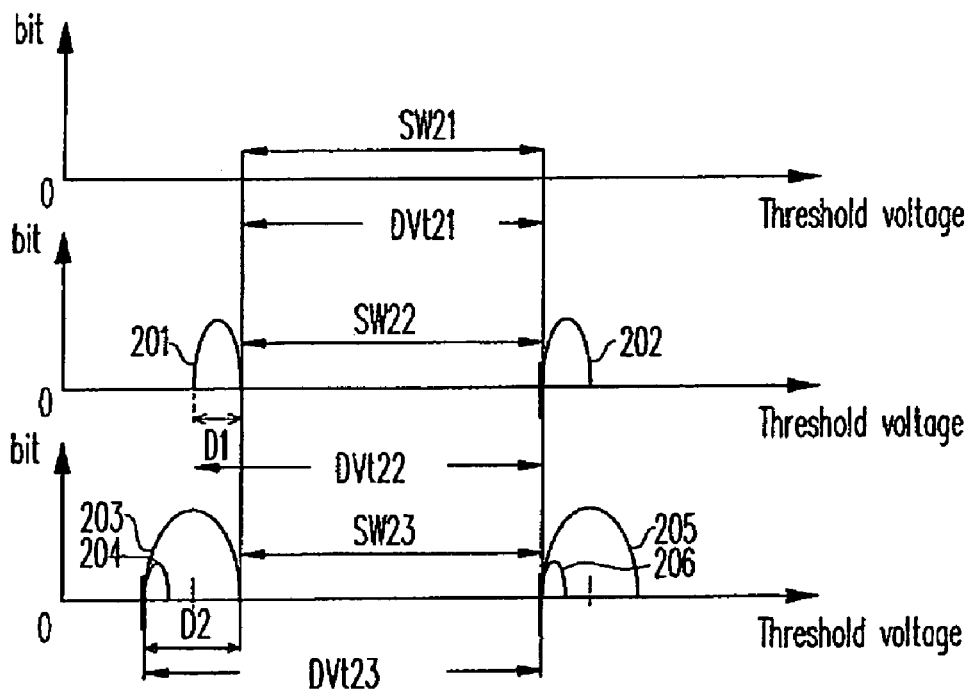
FIG. 2 is a threshold voltage distribution diagram of the data storage operation of another conventional memory unit.
Figure 3:
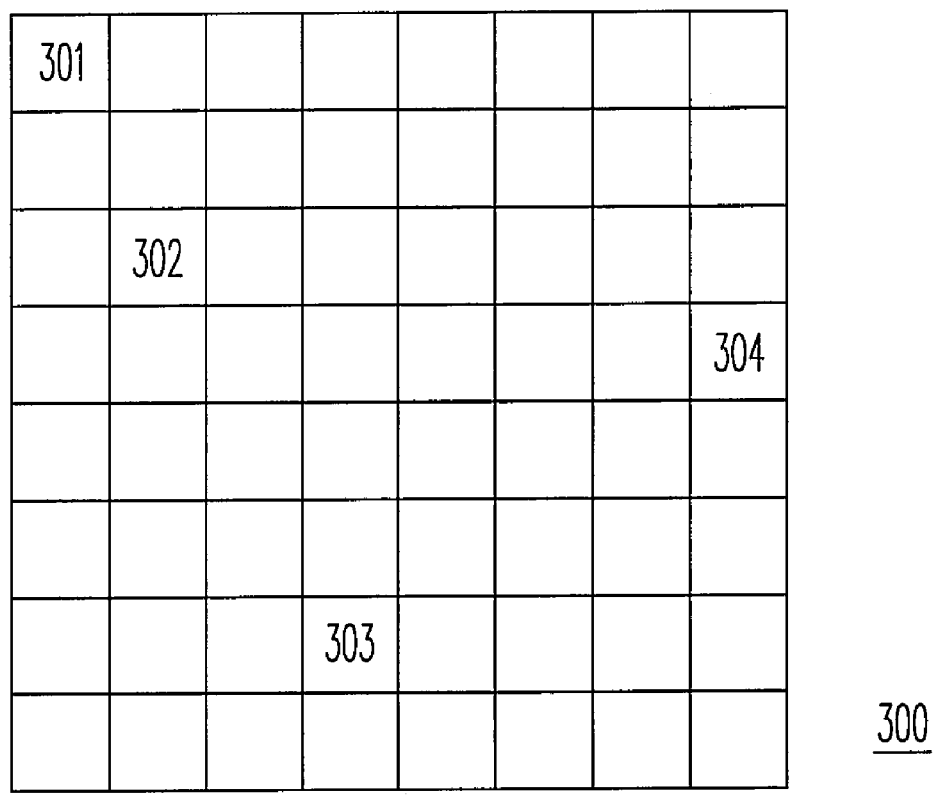
FIG. 3 is a circuit block diagram of the flash memory unit 300 according to an embodiment of the present invention.
Figure 4:
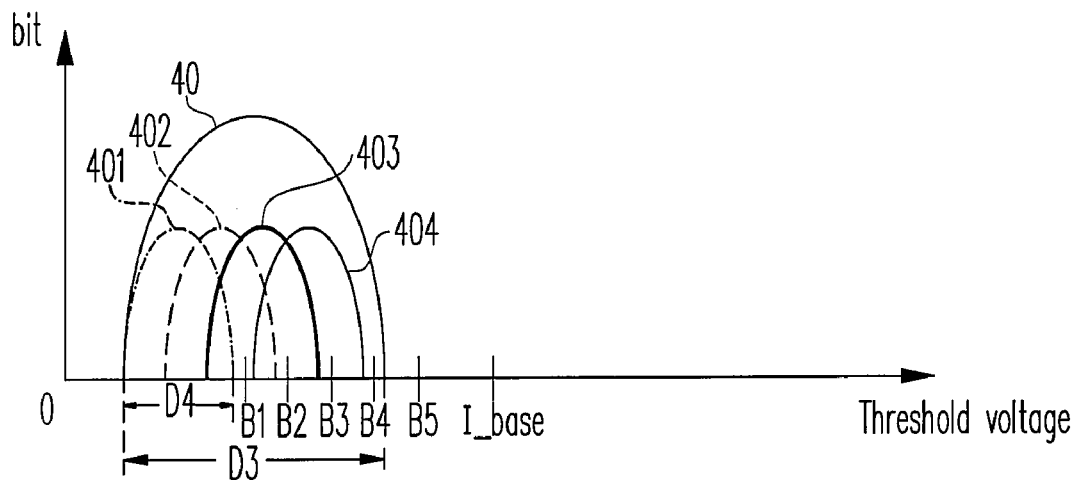
FIG. 4 is a threshold voltage distribution diagram of a method for data storage of a flash memory unit according to an embodiment of the present invention.

FIG. 3 is a circuit block diagram of a flash memory unit 300 according to an embodiment of the present invention. The flash memory unit 300 with a capacity of, for example, 1 G (gigabytes) memory is divided into small memory groups which the capacity is 1M, 301~304 is the four example small groups. FIG. 4 is a threshold voltage distribution diagram of a method for data storage of a flash memory unit according to an embodiment of the present invention. The horizontal axis represents the threshold voltage, and the longitudinal axis represents number of bits. Referring to FIG. 3 and FIG. 4 at the same time, the small memory groups 301~304 are corresponding to threshold voltage distribution curves 401~404, and an originally undivided threshold voltage distribution curve 40 of the flash memory unit 300 is used for comparison. Seen from FIG. 4, the distribution value D3 of the threshold voltage distribution region of the threshold voltage distribution curve 40 is larger than the distribution value D4 of the individual threshold voltage distribution region of the threshold voltage distribution curves 401~404. The sensing window of the flash memory can be increased and the program threshold voltage difference can be reduced by changing the difference of the distribution value (D3-D4). The high boundaries of the distribution curves 401~404 are defined with reference to Point I_base, so as to detect that the high boundary of the curve 401 lies in smaller than the threshold voltage B1, the high boundary of the distribution curve 402 lies in between the threshold voltages B1~B2, the high boundary of the distribution curve 403 lies in between the threshold voltages B2~B3, and the high boundary of the distribution curve 404 lies in between the threshold voltages B3~B4. The originally undivided high boundary of the flash memory unit 300 is between the threshold voltages B4~B5 for comparison.

The memory unit is not limited to be divided into four small memory groups in the embodiment of the present invention, and can be divided into any number of small memory groups for practical needs. For example, a memory unit of 1 G is divided into one million small memory groups, wherein each of the memory group has a capacity of 1K bits, or a memory unit of 1 G is divided into 16 thousand word lines, wherein each word line has a capacity of 64 thousand bits. A plurality of small memory groups is obtained by dividing the memory unit in the present invention and save the voltage threshold distribution information of each small groups by an extra memory or a buffer memory, such that the distribution value of the threshold voltage distribution region is reduced to enhance the storage effect. The voltage threshold distribution information records the threshold regions. However, in the present invention, the memory unit is not limited to be divided into small memory groups with an equal capacity, but can be divided into small memory groups with different capacities. Meanwhile, when storing data, the present invention does not need to consider the high boundary of the memory unit before division, but only has to consider the high boundary of each memory group after division, such that the planing of the program threshold voltage difference between states is flexible. Those skilled in the art should understand that the present invention is not limited to define the high boundaries, but can also define other characteristics of the curve, such as low boundaries or medium values.

Figure 5:
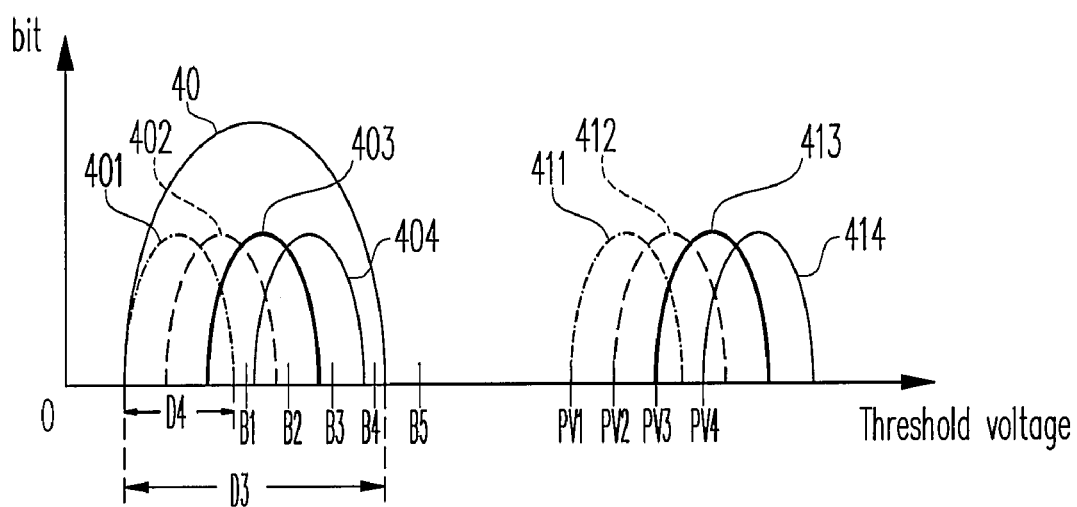
FIG. 5 is another threshold voltage distribution diagram of a method for data storage of a flash memory unit according to an embodiment of the present invention.

FIG. 5 is another threshold voltage distribution diagram of a method for data storage of a flash memory unit according to an embodiment of the present invention. The horizontal axis represents the threshold voltage, and the longitudinal axis represents the number of bits. Referring to FIG. 3 and FIG. 5, the small memory groups 301~304 of FIG. 3 are corresponding to threshold voltage distribution curves 411~414 in another state. For example, the distribution curves 401~404 are corresponding to the first state of logic level "1" for data storage, and the distribution curves 411~414 are corresponding to the second state of logic level "0" for data storage so that the flash memory is a two levels memory. The threshold voltage distribution regions of the distribution curves 401~404 can be used to define the program verify voltage of the distribution curves 411~414. The high boundary of the distribution curve 401 is defined to be smaller than B1, while the program verify voltage of the corresponding distribution curve 411 is defined as PV1. The high boundary of the distribution curve 402 is defined to be between the threshold voltages B1 and B2, while the program verify voltage of the corresponding distribution curve 412 is defined as PV2. The program verify voltages PV3, PV4 are defined likewise.

Figure 6:
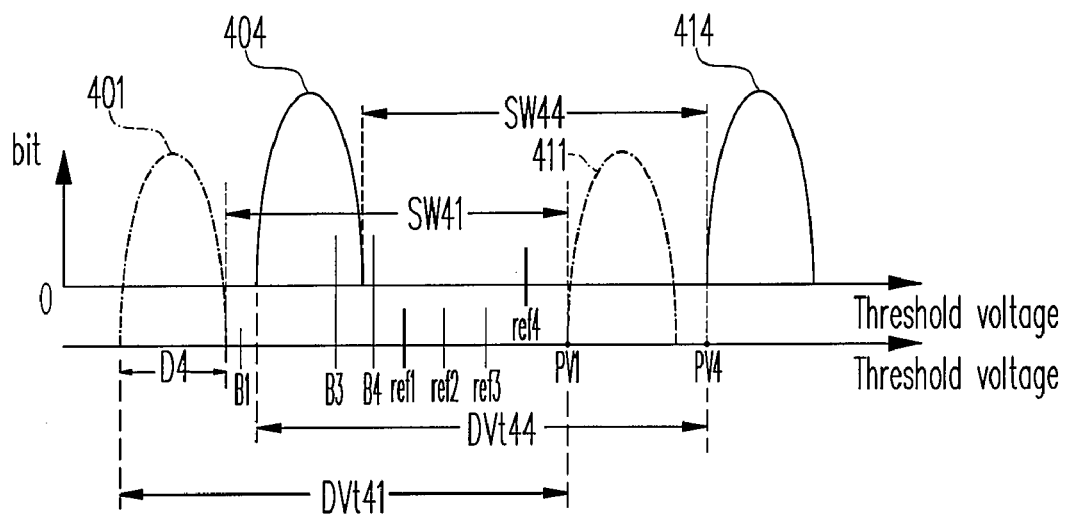
FIG. 6 is still another threshold voltage distribution diagram of a method for data storage of a flash memory unit according to an embodiment of the present invention.

FIG. 6 is another threshold voltage distribution diagram of a method for data storage of a flash memory unit according to an embodiment of the present invention. The horizontal axis represents the threshold voltage, and the longitudinal axis represents the number of bits. To clearly show the difference between each curve, the threshold voltage distribution curve 401 and the threshold voltage distribution curve 411 are located at another threshold voltage axis of the same. Referring to FIG. 5 and FIG. 6, the reference detecting values ref1~ref4 of FIG. 6 are determined according to the planning of the program verify voltages PV1~PV4 of FIG. 5. For example, the middle point between the threshold voltage B1 and the program verify threshold voltage PV1 is determined to be ref1. When the high boundary of the distribution curve 401 is detected to be smaller than B1, the memory group 401 is programmed to PV1, and meanwhile, the reference detecting value ref1 is used as a reference for reading data. When the high boundary of the distribution curve 404 is detected to be between B3 and B4, the memory group 404 is programmed to PV4, and meanwhile, the reference detecting value ref4 is used as a reference for reading data. The ref2 and ref3 are obtained likewise, and the reference detecting values ref1~ref4 can be in the form of threshold voltage and current.

The program threshold voltage difference in this embodiment is the threshold difference between the same thresholds of two curves. Base on each bit has the same program threshold voltage difference is, for example in FIG. 6, the difference between a maximum value (high boundary) of the distribution curve 401 and a minimum value (low boundary) of the distribution curve 411 is the sensing window and using ref1 to be the reference cell threshold voltage level. A minimum value (low boundary) of the distribution curve 401 and the minimum value (low boundary) of the distribution curve 411 is the program threshold voltage difference. Therefore, the program threshold voltage difference between the distribution curve 401 and the distribution curve 411 is DVt41, the program threshold voltage difference between the distribution curve 404 and the distribution curve 414 is DVt44, and the sensing window of the distribution curve 401 and the distribution curve 411 is SW41, the sensing window of the distribution curve 404 and the distribution curve 414 is SW44 and using ref4 to be the reference cell threshold voltage level. The relationship between the sensing window SW41, the program threshold voltage difference DVt41 and the distribution value D4 is (DVt41−SW41)=D4. In the present invention, as the memory unit is divided into a plurality of small memory groups, the distribution value is reduced, such that the sensing window is increased and the program threshold voltage difference between states is reduced.

Figure 7:
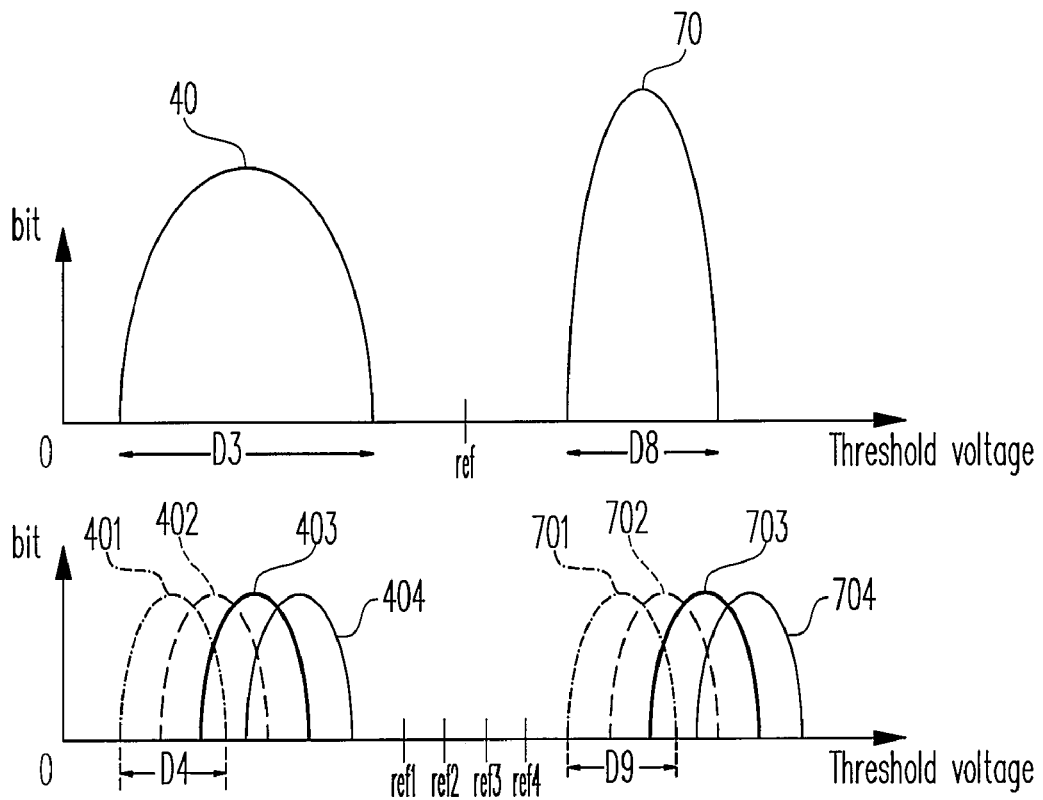
FIG. 7 is a threshold voltage distribution diagram of a method for data storage of a flash memory unit according to another embodiment of the present invention.

FIG. 7 is a threshold voltage distribution diagram of a method for data storage of a flash memory unit according to another embodiment of the present invention. The horizontal axis represents threshold voltage, and the longitudinal axis represents the number of bits. In order to reduce the distribution value and improve the programming speed, the threshold voltage distribution curve 40 is programmed to a narrowed threshold distribution curve 70, and the reference detection point ref is taken as a reading reference. However, the programming of the threshold distribution curve becomes more difficult with the increase of the narrowing degree. In the present invention, the narrowed threshold voltage distribution curve 70 can be divided into threshold voltage distribution curves 701~704, such that the original distribution value D8 is divided into smaller distribution values D9. As the distribution value D3 is significantly different from the distribution value D8, the narrowing process becomes very difficult. However, after the division, as the distribution value D4 is close to the distribution value D9, the narrowing process becomes much easier. When the same sensing windows are to be created, the present invention has a smaller program threshold voltage difference. Thus, the cycling margin is improved and two bits effects are achieved.

Figure 8:
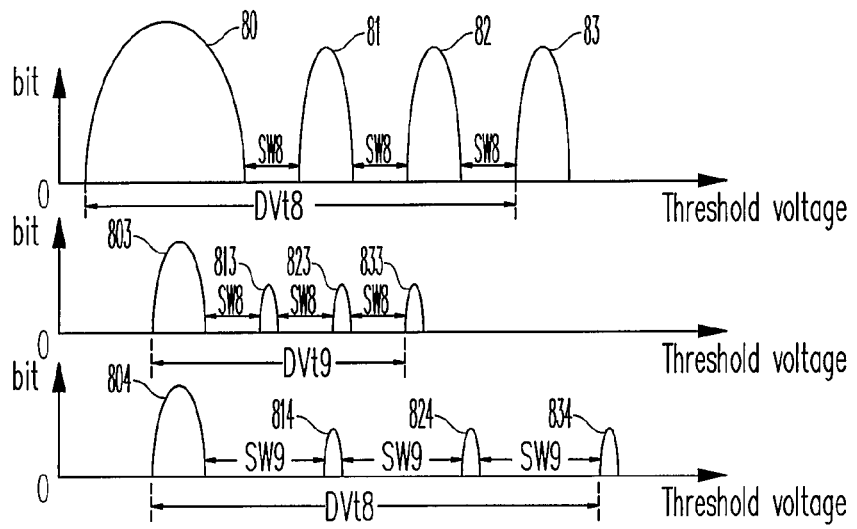
FIG. 8 is a threshold voltage distribution diagram of a method for data storage of a flash memory unit according to still another embodiment of the present invention.

FIG. 8 is a threshold voltage distribution diagram of a method for data storage of a flash memory unit according to still another embodiment of the present invention. The horizontal axis represents the threshold voltage, and the longitudinal axis represents the number of bits. To illustrate the operating method of the present invention in the MLC, the threshold voltage distribution curves 80~83 represent four different data storage states respectively, for example, logic levels "11", "01", "00", "10", and the threshold voltage distribution curves 81~83 are corresponding to the narrowed threshold voltage distribution curves. As multiple logic levels are required to be processed, the program threshold voltage difference DVt8 between different states is increased, while the sensing window SW8 is reduced. In the first design, after the memory unit is divided, the threshold voltage distribution curves 803, 813, 823, 833 have a lower program threshold voltage difference DVt9 between states under the same sensing window SW8. In the second design, after the memory unit is divided, under the same threshold voltage difference DVt8, the threshold voltage distribution curves 804, 814, 824, 834 have a larger sensing window SW9. Those skilled in the art should understand that the MLC of the present invention is not limited to four states, and the logic levels and data storage states can be increased optionally.

Figure 9:
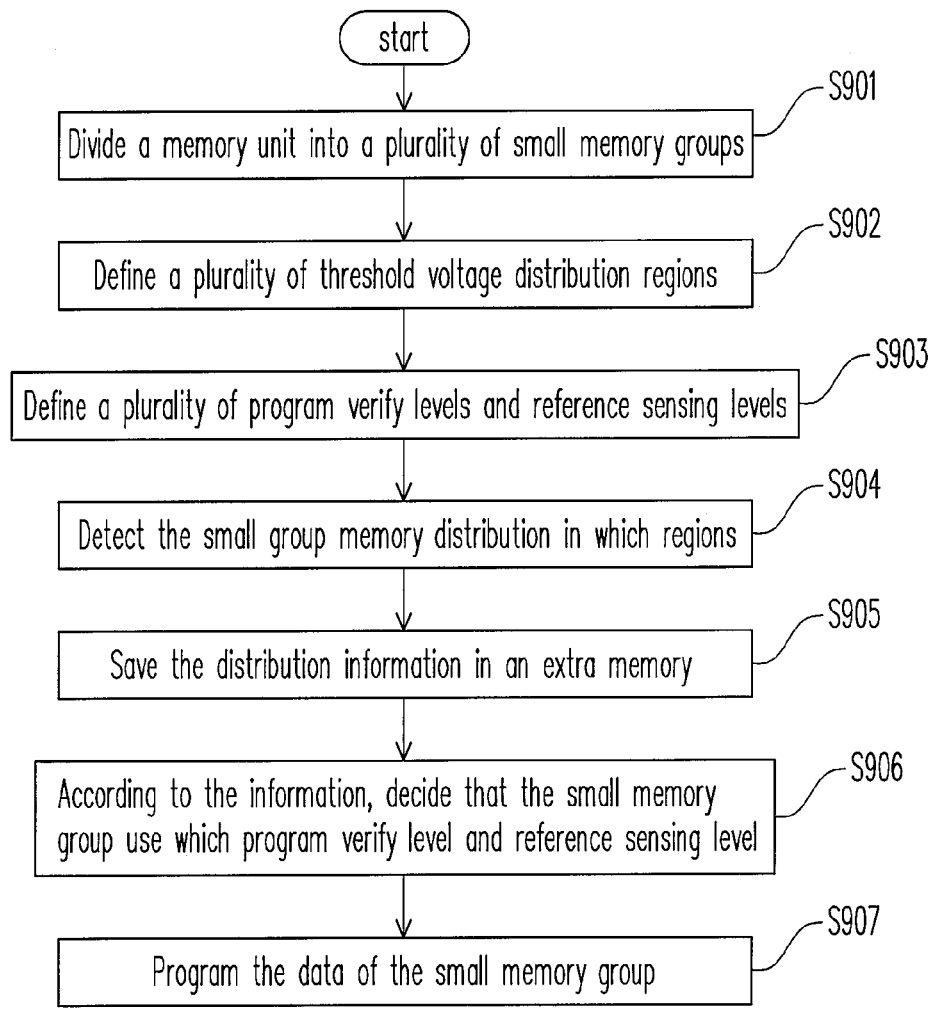
FIG. 9 is a flow chart of a method for data storage of a flash memory unit according to an embodiment of the present invention.

FIG. 9 is a flow chart of a method for data storage of a flash memory unit according to an embodiment of the present invention. First, in Step S901, a memory unit is divided into a plurality of small memory groups; next, in Step S902, a plurality of threshold voltage distribution regions for each small memory group is defined; then, in Step S903, a plurality of program verify levels and a plurality of reference sensing levels are defined according to the boundaries of the threshold voltage distribution region of each of the small memory groups; For example, the plurality of program verify levels may be a plurality of program verify voltages threshold and the plurality of reference sensing levels may be the plurality of reference threshold voltage reference. after that, in Step S904, a plurality of small memory groups is detected; then in Step S905, the distribution information of the small memory groups is saved in an extra memory; The distribution information records the plurality of threshold voltage distribution regions. Those skilled in the art should understand that the distribution information is not limited to be saved in an extra memory, may include any memory which can the distribution data, such as a buffer memory. then in Step S906, according to the information, one small memory group is decided by using its program verify level and reference sensing level, and then in step S907, the data of the small memory group is programmed.

In view of the above, in the method for data storage of a memory unit according to the present invention, the memory unit is divided into a plurality of small memory groups, thus reducing the distribution value of the threshold voltage region, increasing the sensing window and reducing the program threshold voltage, such that the cycling margin of the memory is improved, the service life of the memory is prolonged, and the present invention is suitable to be applied to the operating window of an MLC.

Though the present invention has been disclosed above by the preferred embodiments, they are not intended to limit the invention. Anybody skilled in the art can make some modifications and variations without departing from the spirit and scope of the invention. Therefore, the protecting range of the invention falls in the appended claims.

What is claimed is:

1. A method for data storage of a memory unit, comprising:
   dividing a memory unit into the plurality of small memory groups;
   defining a plurality of threshold voltage distribution regions for the small memory groups, wherein each of the small memory groups has at least one of the threshold voltage distribution regions;
   defining a plurality of program verify threshold voltages and a plurality of reference detecting values for each of the small memory groups according to the threshold voltage distribution regions of each of the small memory groups; and
   using the small memory groups to store data.

2. The method for data storage of a memory unit as claimed in claim 1, wherein the memory unit is a two levels memory.

3. The method for data storage of a memory unit as claimed in claim 1, wherein the memory unit is a MLC (multi-level-cell) memory.

4. The method for data storage of a memory unit as claimed in claim 1, further comprising saving small memory groups distribution information into an extra memory, wherein the small memory groups distribution information records the plurality of threshold voltage distribution regions.

5. The method for data storage of a memory unit as claimed in claim 1, further comprising saving small memory groups distribution information into a buffer memory, wherein the small memory groups distribution information records the plurality of threshold voltage distribution regions.

6. The method for data storage of a memory unit as claimed in claim 1, further comprising defining the program verify threshold voltages and the reference detecting values for each of the small memory groups according to each high boundary of each of the threshold voltage distribution regions of the small memory groups.

7. The method for data storage of a memory unit as claimed in claim 1, further comprising defining the program verify threshold voltages and the reference detecting values of each of the small memory groups according to each low boundary of each of the threshold voltage distribution regions of the small memory groups.

8. The method for data storage of a memory unit as claimed in claim 1, further comprising defining the program verify threshold voltages and the reference detecting values of each of the small memory groups according to each maximum value of each of the threshold voltage distribution regions of the small memory groups.

9. The method for data storage of a memory unit as claimed in claim 1, wherein the reference detecting values of each of the small memory groups are a plurality of reference threshold voltage values.

10. The method for data storage of a memory unit as claimed in claim 1, wherein the reference detecting values of each of the small memory groups are a plurality of reference current values.

11. The method for data storage of a memory unit as claimed in claim 1, wherein the memory unit is a flash memory.

12. The method for data storage of a memory unit as claimed in claim 1, wherein the memory unit is an erasable programmable read only memory (EPROM).

13. The method for data storage of a memory unit as claimed in claim 1, wherein the memory unit is an electrically erasable programmable read only memory (EEPROM).

14. The method for data storage of a memory unit as claimed in claim 1, further comprising using a plurality of distribution values to determine the plurality of threshold voltage distribution regions respectively, wherein each of the distribution values is equal to each of a plurality of first differences between the program verify threshold voltages minus each of a plurality of sensing windows.

15. The method for data storage of a memory unit as claimed in claim 14, wherein each of the first differences between each of the program verify threshold voltages is reduced by changing each of a plurality of second differences between the distribution values.

* * * * *